US006824391B2

(12) United States Patent
Mickievicz et al.

(10) Patent No.: US 6,824,391 B2
(45) Date of Patent: *Nov. 30, 2004

(54) ELECTRICAL CONNECTOR HAVING CUSTOMIZABLE CIRCUIT BOARD WAFERS

(75) Inventors: Scott K. Mickievicz, Elizabethtown, PA (US); David W. Helster, Harrisburg, PA (US); George R. Defibaugh, Mechanicsburg, PA (US); Lynn Robert Sipe, Mifflintown, PA (US)

(73) Assignee: Tyco Electronics Corporation, Middletown, PA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/498,268

(22) Filed: Feb. 3, 2000

(65) Prior Publication Data

US 2002/0009926 A1 Jan. 24, 2002

(51) Int. Cl.[7] .............................................. H01R 13/648
(52) U.S. Cl. ............................. 439/61; 439/65; 439/608
(58) Field of Search ...................... 439/76.1, 65, 74.5, 439/108, 607, 8, 9, 79, 61

(56) References Cited

U.S. PATENT DOCUMENTS

| 4,571,014 A | 2/1986 | Robin et al. ............... 339/14 R |
| 4,705,332 A | * 11/1987 | Sadigh-Behzadi ........... 439/69 |
| 5,066,236 A | 11/1991 | Broeksteeg ................ 439/79 |
| 5,522,727 A | 6/1996 | Saito et al. ................ 439/65 |
| 5,702,258 A | 12/1997 | Provencher et al. ......... 439/79 |
| 5,724,421 A | * 3/1998 | Tuvy et al. ................ 439/922 |
| 5,860,816 A | 1/1999 | Provencher et al. ......... 439/79 |
| 5,924,899 A | 7/1999 | Paagman ................... 439/701 |
| 6,083,047 A | 7/2000 | Paagman ................... 439/608 |
| 6,109,933 A | * 8/2000 | Lenoir et al. ............... 439/79 |
| 6,168,469 B1 | 1/2001 | Lu .......................... 439/608 |
| 6,171,149 B1 | 1/2001 | van Zanten ................ 439/608 |

FOREIGN PATENT DOCUMENTS

| EP | 0 852 414 A2 | 7/1998 | ........... H01R/23/68 |
| EP | 0 854 549 A2 | 7/1998 | ........... H01R/23/68 |
| WO | WO 97/02627 | 1/1997 | ......... H01R/13/648 |

* cited by examiner

*Primary Examiner*—Renee Luebke

(57) ABSTRACT

An electrical connector includes a housing (12) and circuit boards (13) carried by the housing. The circuit boards extend parallel to each other in spaced-apart relationship. The circuit boards include signal tracks (14) that provide electrical paths through the connector. The electrical paths extend from a mating interface (16) at one end of the connector to a mounting interface (17) at another end of the connector. The circuit boards include a first type (1) and a second type (2), the first type having circuitry arranged in a first pattern, and the second type having circuitry arranged in a second pattern which is different than the first pattern.

3 Claims, 15 Drawing Sheets

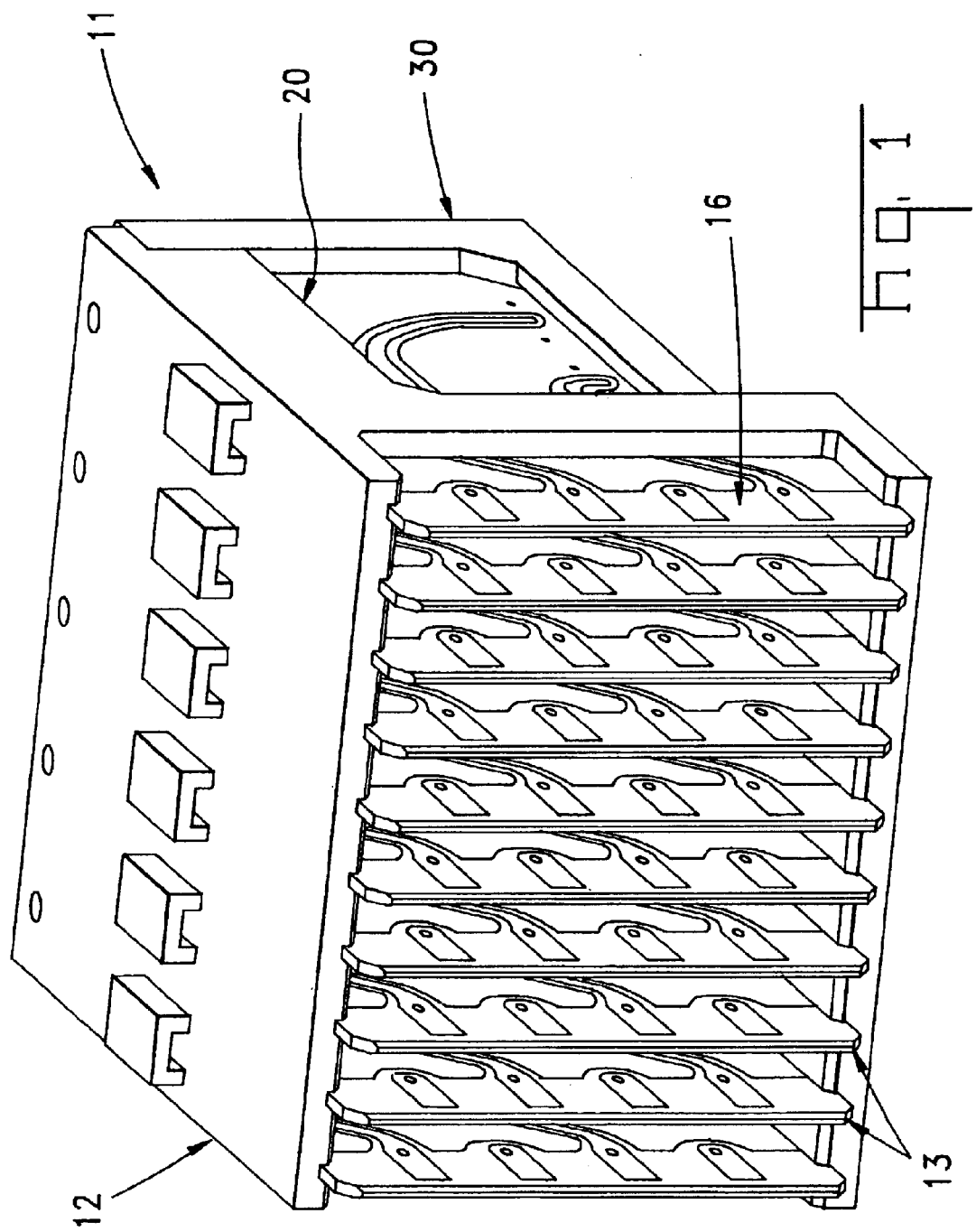

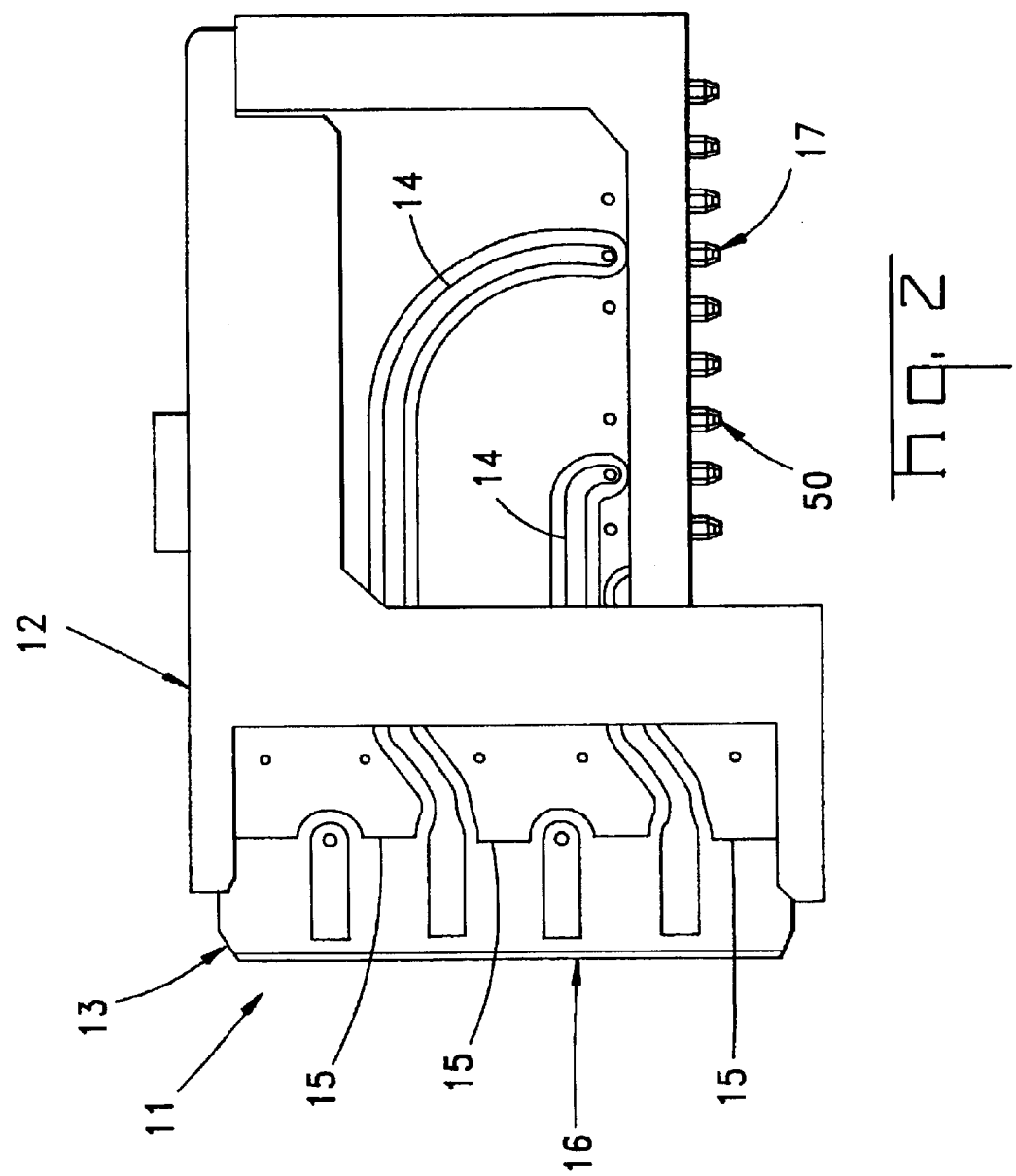

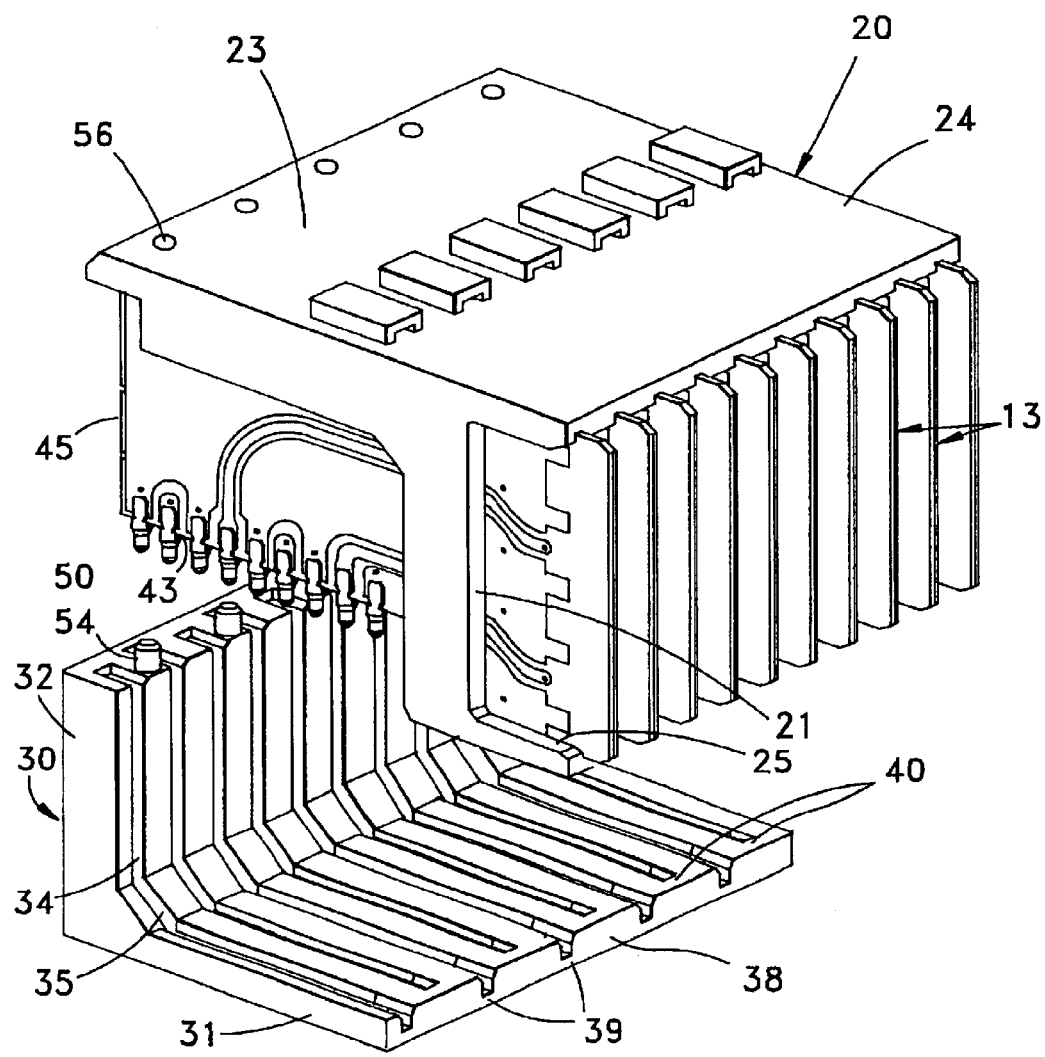
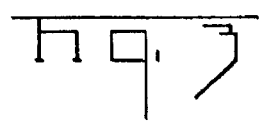

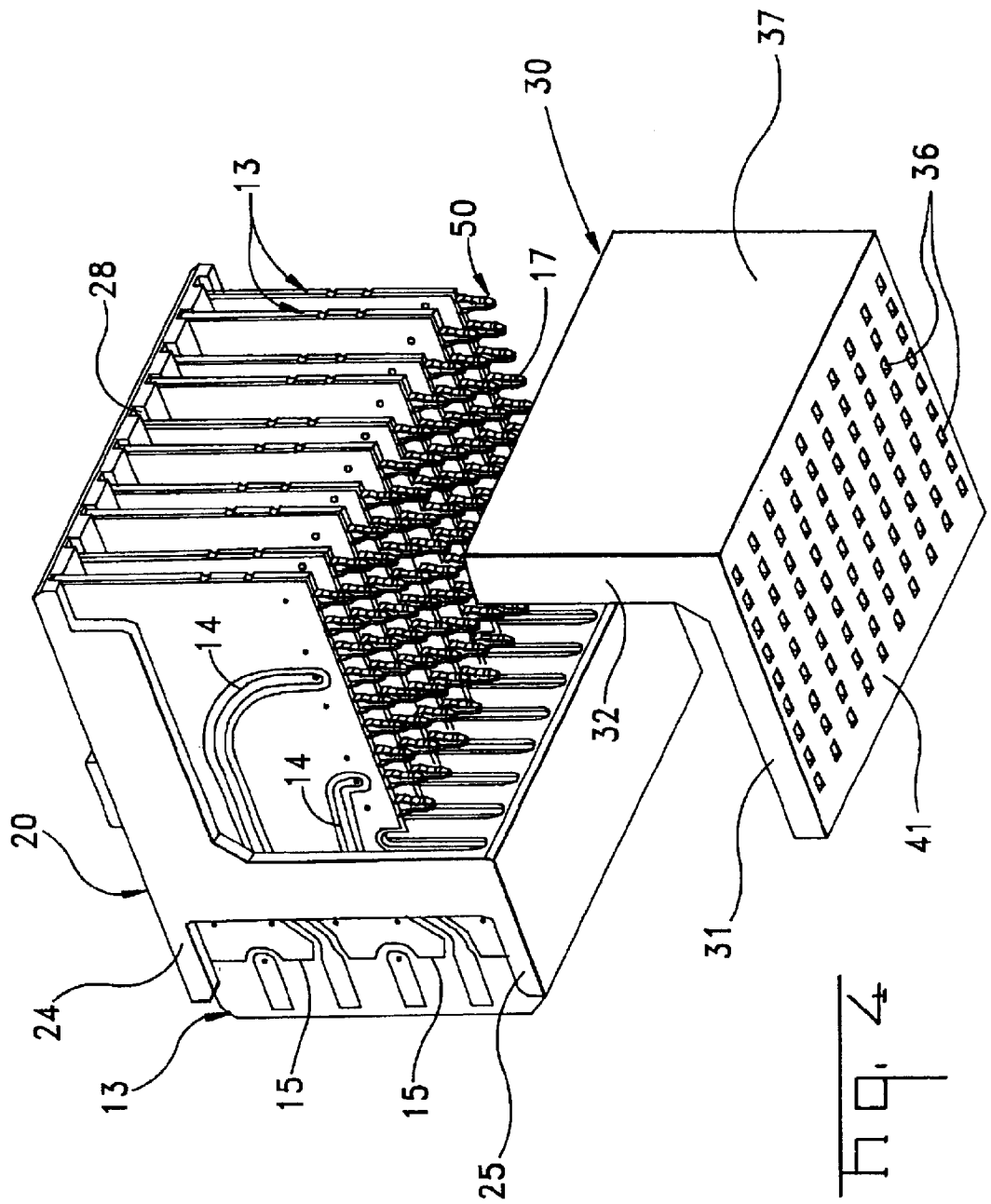

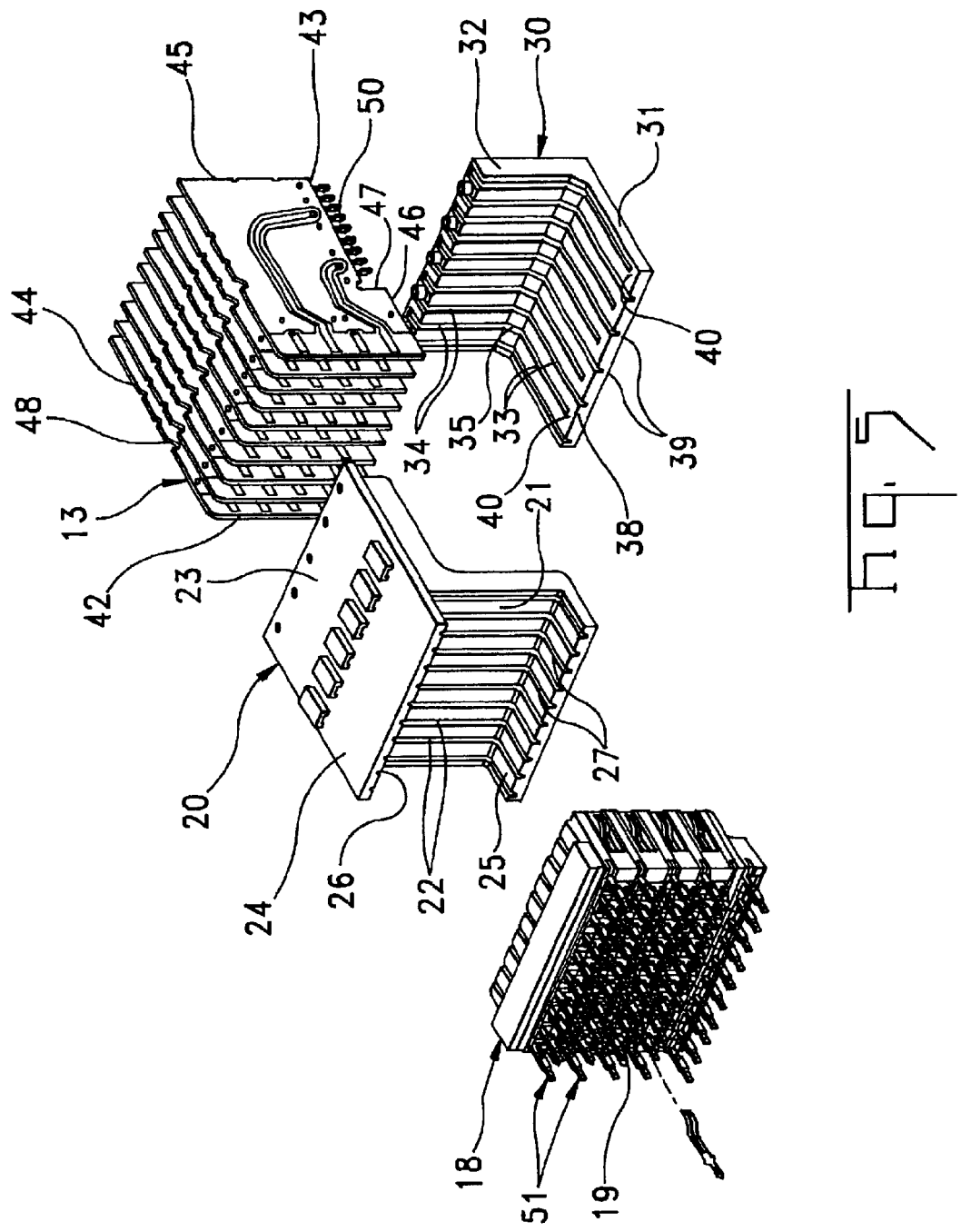

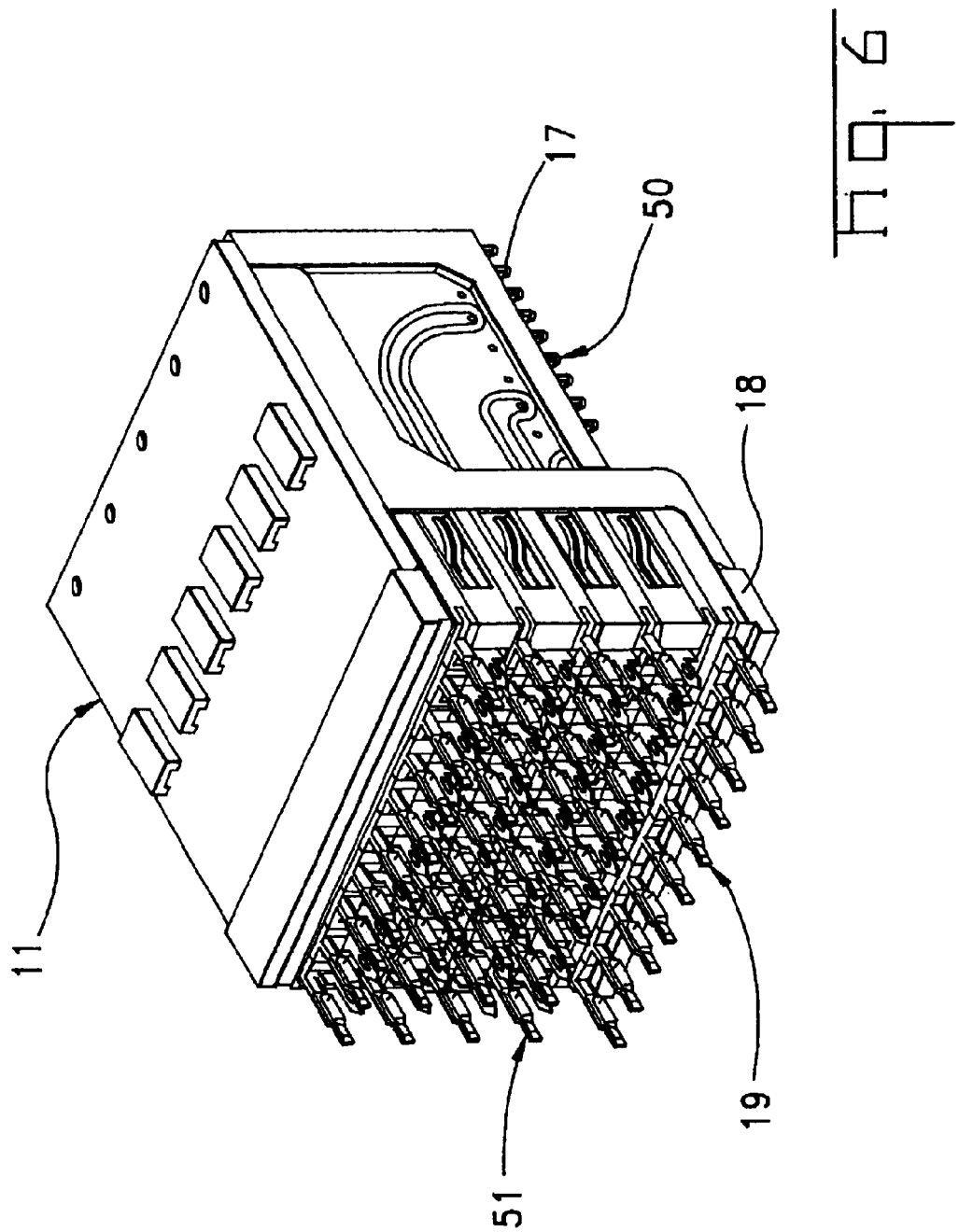

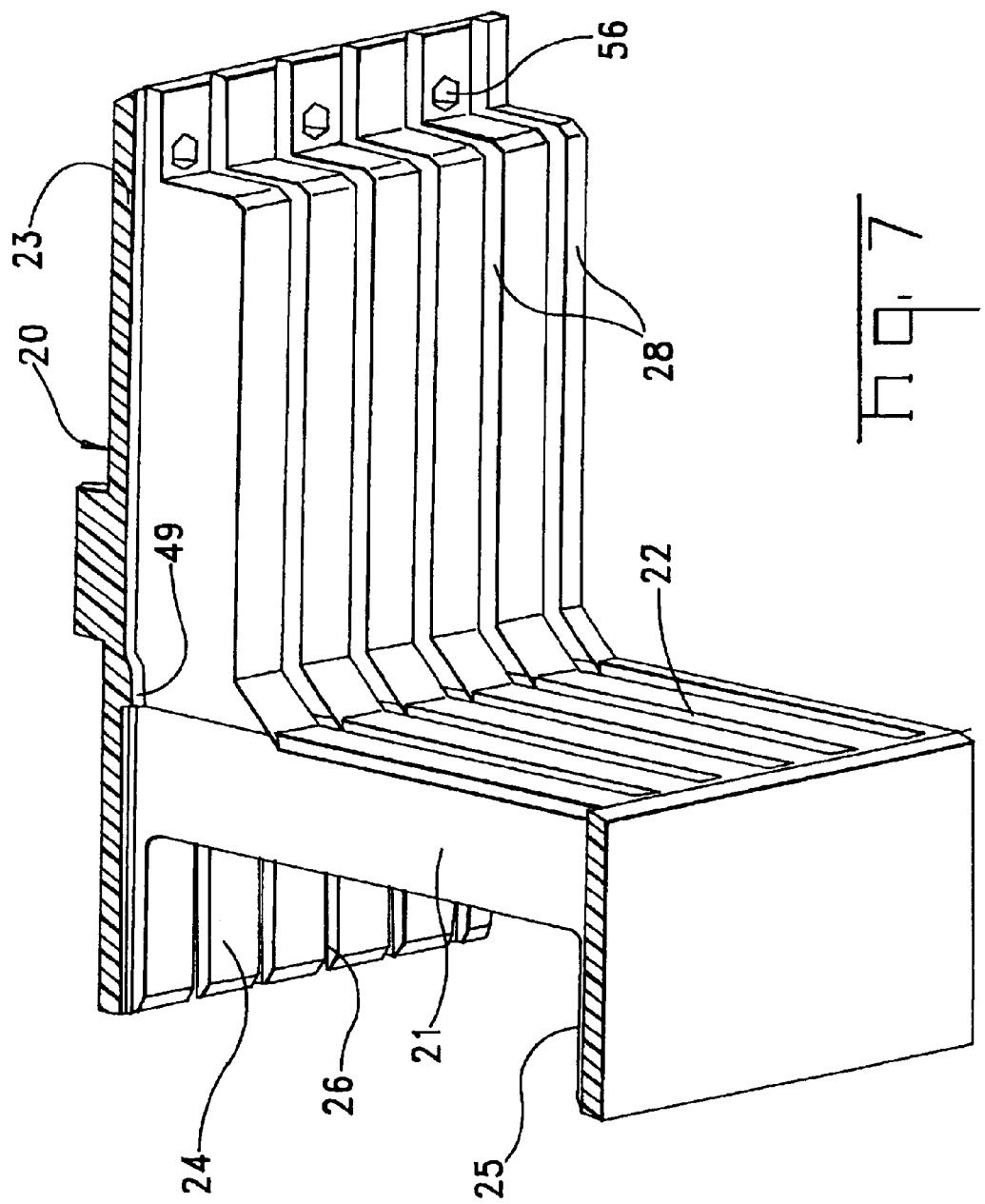

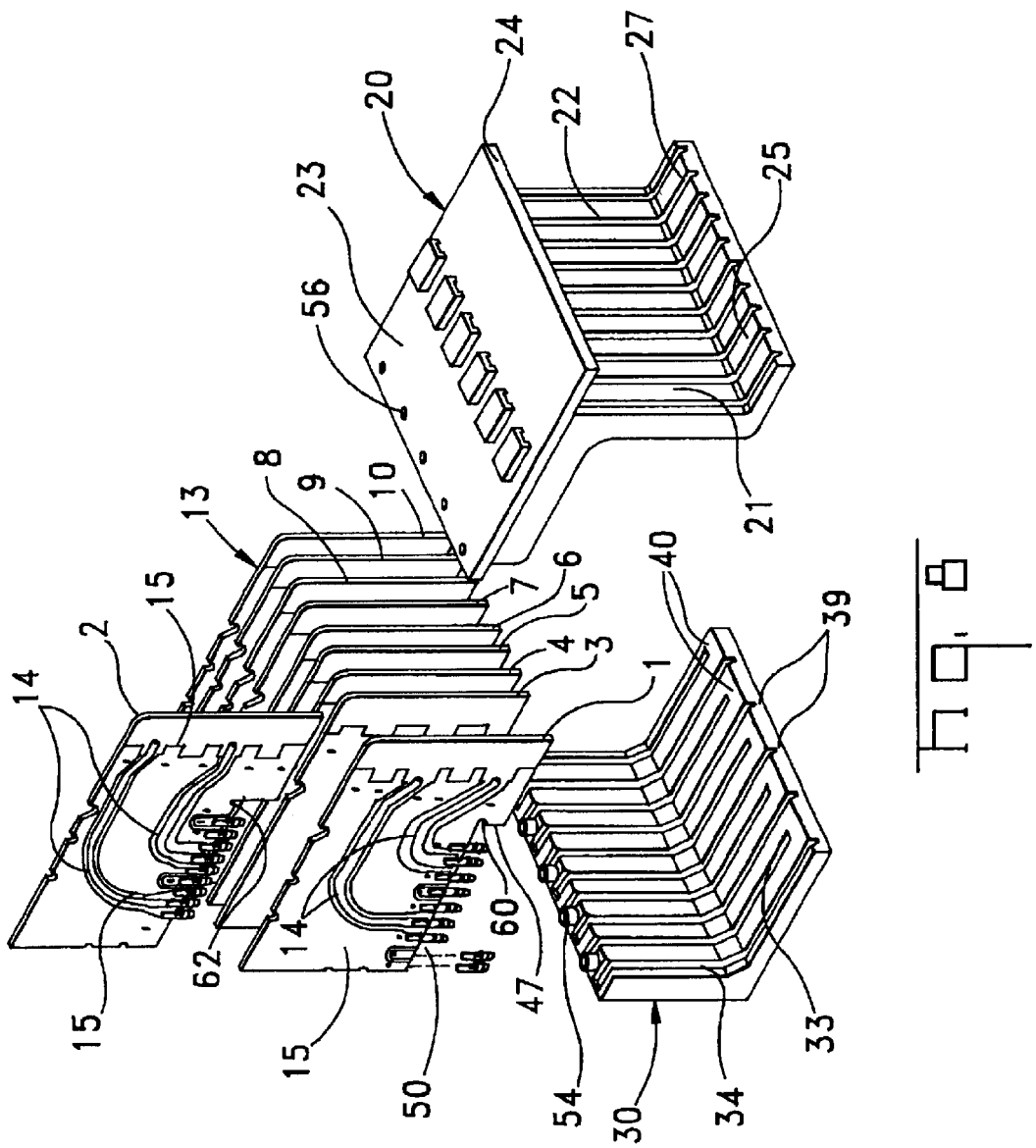

ELECTRICAL CONNECTOR HAVING CUSTOMIZABLE CIRCUIT BOARD WAFERS

FIELD OF THE INVENTION

The invention relates to an electrical connector of the type having multiple rows and columns of conductive elements for connection with a circuit board.

BACKGROUND OF THE INVENTION

Electrical connectors for interconnecting a circuit board backplane to a daughterboard generally comprise two mating connector halves each having multiple rows and columns of conductive elements or contacts. It is known to provide each column of contacts as a separate module that includes a vertical array of contacts having an overmolded carrier. Multiple modules are installed in a connector housing to form a complete connector. See, for example, U.S. Pat. No. 5,066,236. Generally, all of the modules in such a connector are substantially identical. However, there are times when it would be desirable to have different types of modules in a connector in order to accommodate different electrical characteristics of signals through the connector. A problem results in that additional tooling and handling is required for the different types of modules, thereby increasing manufacturing costs.

The backplane to daughterboard connectors have a high contact density and are required to operate at relatively high electrical speeds. Due to continuing trends toward miniaturization and improved electrical performance by the electronics industry, requirements for greater contact density and higher electrical speeds are constantly being promulgated. These requirements lead to design conflicts, especially when electrical speeds are in the range of approximately 500 megahertz and above, due to the fact that increasing the contact density places the contacts in closer proximity to each other, thereby leading to crosstalk between neighboring contacts in different signal pairs.

SUMMARY OF THE INVENTION

It is an object of the invention to provide an electrical connector of simple and economical construction for mounting on a circuit board.

It is another object of the invention to provide an electrical connector having a modular construction.

It is a further object of the invention to provide an electrical connector having a high contact density which is suitable for use with very high speed electrical signals.

It is yet another object of the invention to improve the electrical performance of a circuit board mountable electrical connector.

It is still another object of the invention to provide a modular electrical connector that can be customized with modules having different electrical characteristics.

These and other objects are accomplished by an electrical connector comprising a housing and circuit boards carried by the housing, the circuit boards extending parallel to each other in spaced-apart relationship, the circuit boards providing electrical paths through the connector, and the electrical paths extending from a mating interface at one end of the connector to a mounting interface at another end of the connector.

According to another aspect, the circuit boards include a first type and a second type. The first type has circuitry arranged in a first pattern, and the second type has circuitry arranged in a second pattern which is different than the first pattern.

According to another aspect, multiple circuit boards of the first and second types are arranged in an alternating sequence in the connector.

According to another aspect, pairs of opposed signal tracks on the first and second types are dedicated to respective electrical signal pairs through the connector.

BRIEF DESCRIPTION OF THE DRAWINGS

The invention will now be described by way of example with reference to the accompanying drawings wherein:

FIG. 1 is a right front isometric view of an electrical connector according to the invention;

FIG. 2 is a side elevation view of the connector;

FIG. 3 is a partially exploded left front isometric view of the connector;

FIG. 4 is a partially exploded right rear isometric view of the connector;

FIG. 5 is an exploded isometric view of the connector and a mating electrical connector;

FIG. 6 is an isometric view of the connector and its mating electrical connector in mated condition;

FIG. 7 is an isometric cross-sectional view through a front housing of the connector;

FIG. 8 is an exploded left front isometric view of the connector;

DETAILED DESCRIPTION OF A PREFERRED EMBODIMENT

Figure 9:
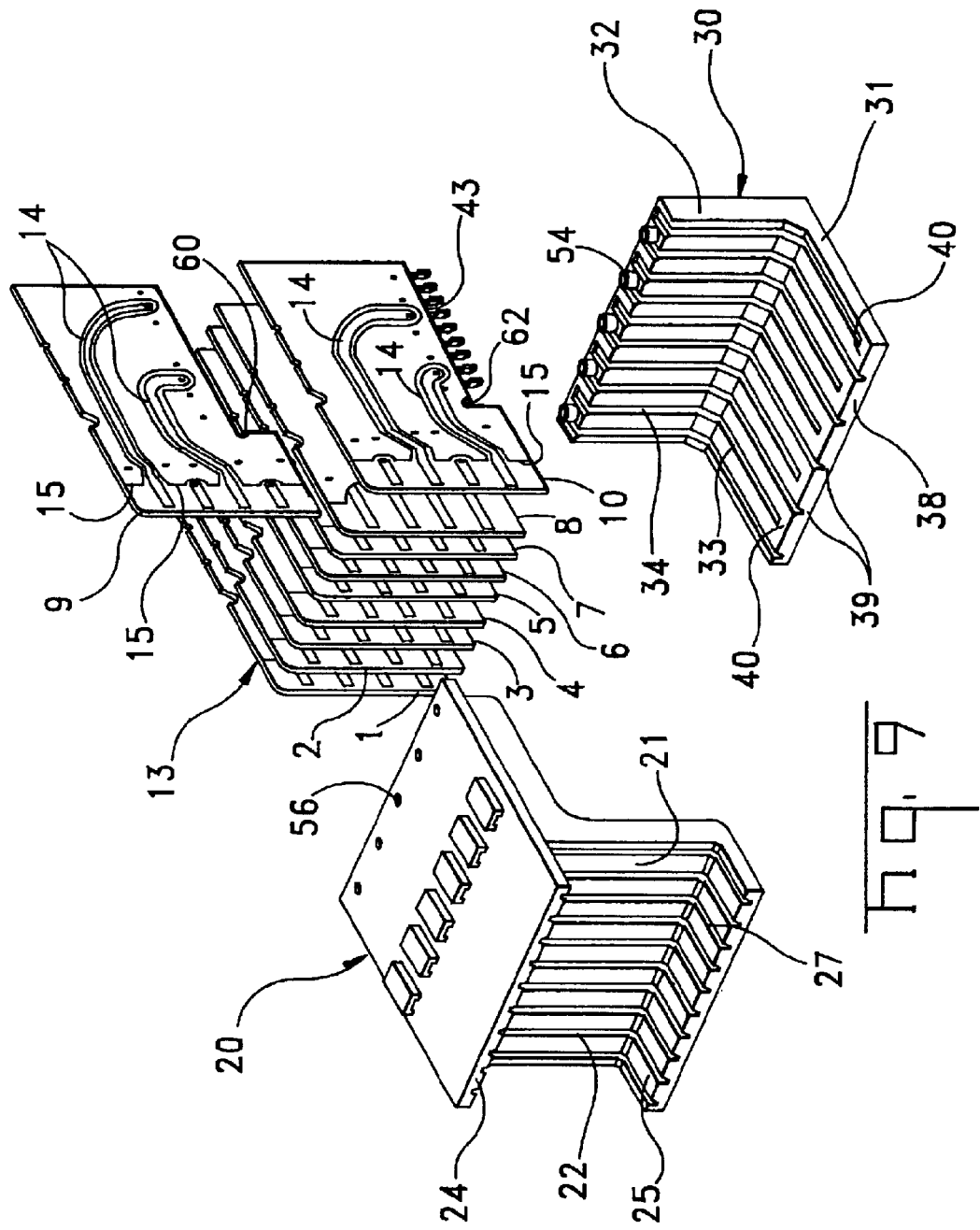
FIG. 9 is an exploded right front isometric view of the connector.

As shown in FIGS. 1-5, an electrical connector 11 according to the invention comprises a dielectric housing 12 which holds a plurality of circuit boards or wafers 13. Each of the wafers includes a dielectric substrate which can be made of conventional circuit board substrate material, such as FR4, and conductive signal tracks 14 and ground tracks 15 on the substrate. The signal and ground tracks provide electrical paths through the connector from a mating interface 16 at one end of the connector which is adapted for connecting with a mating electrical connector 18, shown in FIG. 5, to a mounting interface 17 at another end of the connector which is adapted for connecting with a daughterboard (not shown).

Similarly, the mating electrical connector 18 has a mounting interface 19 which is populated by contacts 51 and is adapted for connecting with a motherboard (not shown). The connectors 11 and 18, shown in mated condition in FIG. 6, serve to interconnect a daughterboard to a motherboard.

With reference to FIGS. 3-5 and 7, the housing 12 is a two-piece member including a front housing 20 and an organizer 30. The front housing includes a front wall 21 having a plurality of parallel apertures 22 that extend through the front wall. The front housing also includes a top wall 23 that extends rearwardly from the front wall, and upper and lower shrouds 24, 25 that extend forwardly from the front wall. The upper and lower shrouds 24, 25 have grooves 26, 27 which are aligned with the apertures 22, and the top wall 23 has slots 28 which are aligned with the apertures.

Each of the circuit board wafers 13 has a mating edge 42, a mounting edge 43, a top edge 44, a back edge 45, a bottom edge 46 and a rearward edge 47. A plurality of terminals 50 are secured to the mounting edge such as by soldering. The wafers 13 are installed in the front housing 20 by inserting the mating edges 42 of the wafers through the apertures 22 from the rear of the front wall. Each of the wafer top edges 44 has a notch 48 which receives a corresponding projection 49, shown in FIG. 7, within a respective one of the slots 28 of the front housing.

The organizer 30 includes a bottom wall 31 and a back wall 32 which are formed with a series of horizontal slots 33 and vertical slots 34 that are aligned with and connected to each other at junction region 35. These horizontal and vertical slots are spaced-apart in correspondence with the plurality of apertures 22 in the front wall 21. The horizontal slots 33 are open through apertures 36 to an underside 41 of the bottom wall, as shown in FIG. 4, but the vertical slots 34 are not open through rear face 37 of the back wall. The horizontal slots 33 are of two types that are arranged in an alternating sequence. The slots 33 of one type extend to a forward edge 38 of the bottom wall 31 to define lands 39 between the slots 33 and the underside 41. The slots 33 of another type have ends that are spaced from the forward edge 38 by a web 40 at the forward edge, for a purpose that will be explained hereinbelow.

The organizer 30 is attached to the front housing 20 after the wafers 13 are installed in the front housing. The mounting and back edges 43, 45, of the wafers are received in the horizontal and vertical slots 33, 34, respectively. The terminals 50 of each wafer extend through respective ones of the apertures 36 and extend beyond the underside 41 of the bottom wall 31 where they are exposed for insertion into corresponding through-holes in a daughterboard (not shown). The terminals 50 are held in the apertures 36 by a slight interference fit, thereby stabilizing the terminals which form the mounting interface 17 of the connector. The organizer 30 has posts 54 along a top edge of the back wall 32, and these posts are interference fitted in holes 56 in the top wall 23 of the front housing to secure the organizer thereto, thereby securely capturing the wafers 13 in the housing 11.

According to one aspect of the invention as shown in FIGS. 8 and 9, the wafers 13 are of two different types that are arranged in an alternating sequence in the connector. The wafers have a keying feature to ensure proper loading in the housing. Keying is provided by either a horizontal recess 60 in the rearward edge 47 of the wafer, or a vertical recess 62 in the mounting edge 43. The horizontal recess 60 is keyed to one of the lands 39 of the organizer, while the vertical recess 62 is keyed to one of the webs 40 of the organizer.

In the particular embodiment shown, there are ten wafers numbered consecutively 1–10, with the odd numbered wafers being of a first type and the even numbered wafers being of a second type. On the face of each wafer are alternating signal tracks 14 and ground tracks 15, and the different types of wafers are distinguished by different layouts of the signal and ground tracks. In the present example, each wafer face has two signal tracks 14 which are flanked along substantially their entire lengths by the ground tracks 15 which are broad areas of conductive material. The ground tracks are spaced-apart from the signal tracks by gaps to prevent shorting.

Figure 10:
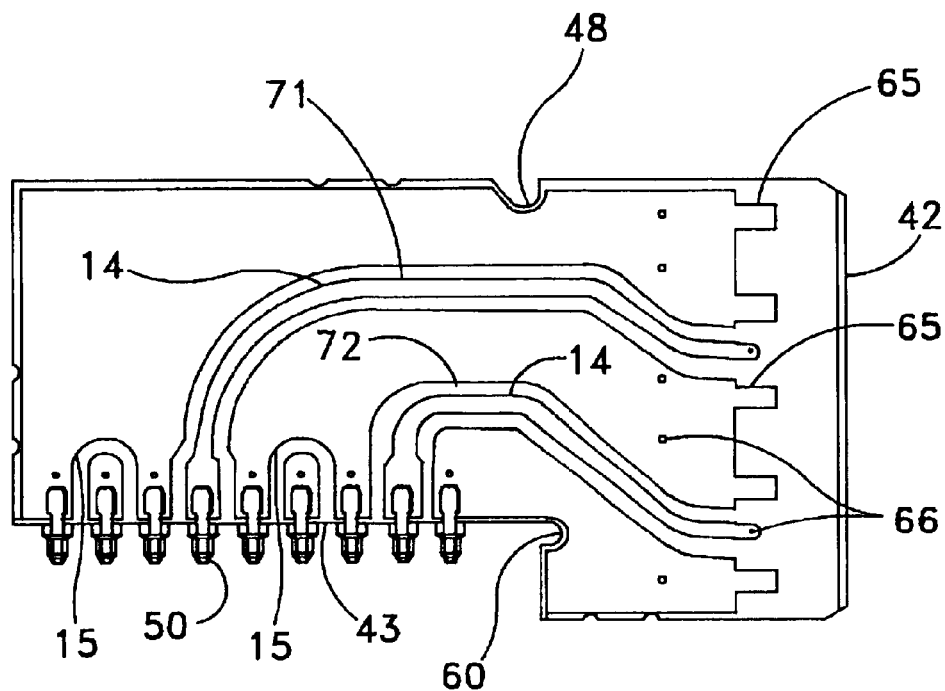
FIG. 10 is a left side elevation view of a first type of circuit board that may be used in the connector.
Figure 11:
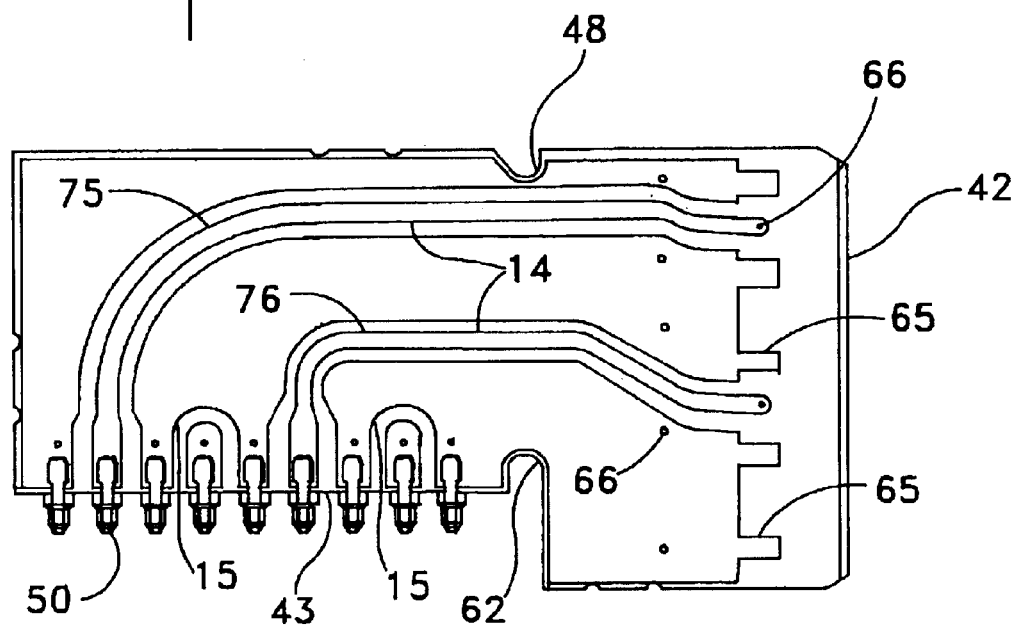
FIG. 11 is a left side elevation view of a second type of circuit board that may be used in the connector.
Figure 12:
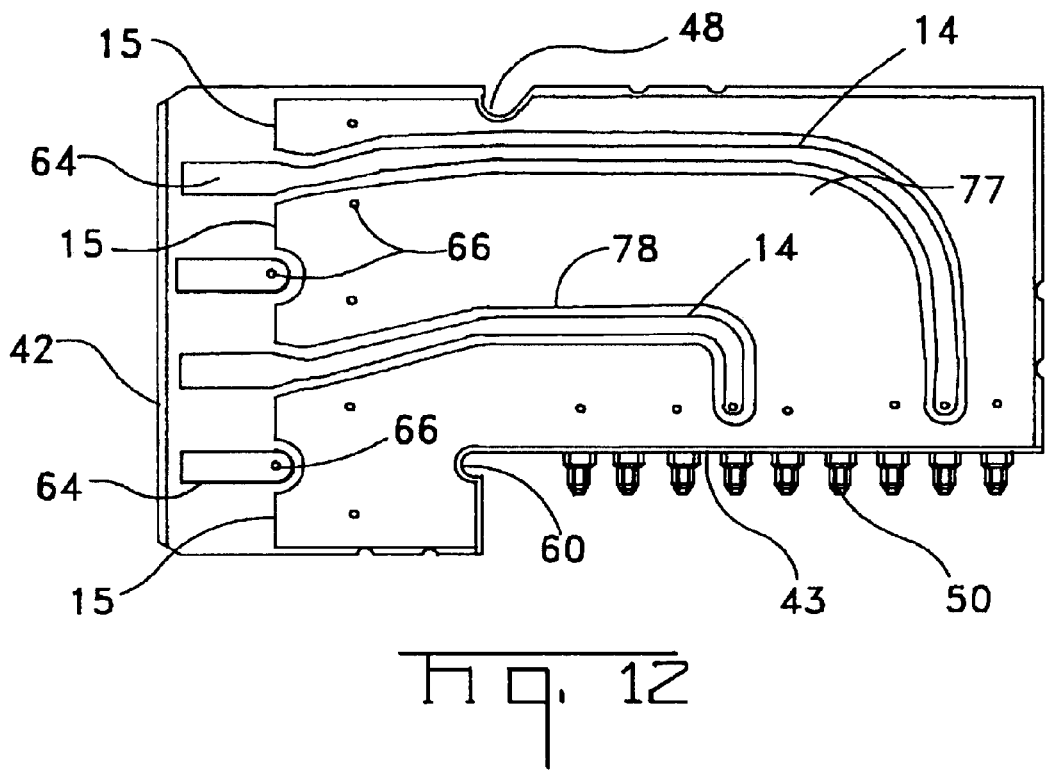
FIG. 12 is a right side elevation view of the first type of circuit board.
Figure 13:
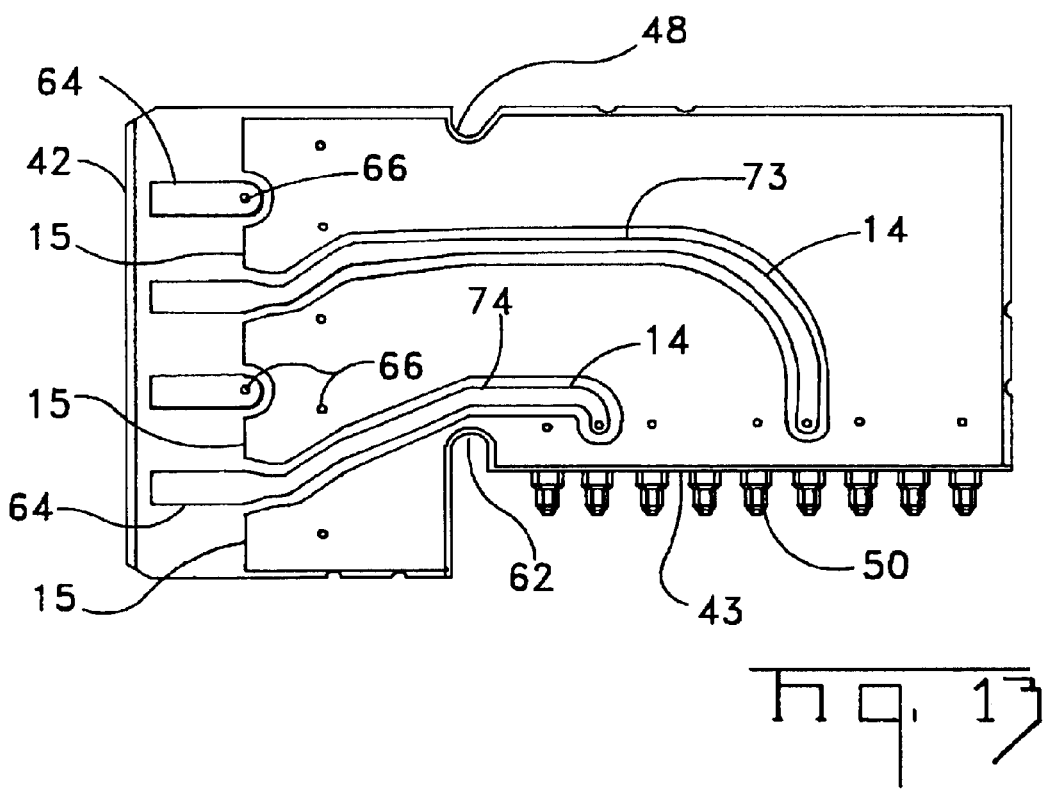
FIG. 13 is a right side elevation view of the second type of circuit board.

With reference to FIGS. 10-13, the two types of wafers are shown in exemplary embodiments. FIGS. 10 and 11 are plan views of the faces of two wafers which are adjacent in the connector, and FIGS. 12 and 13 are plan views of two adjacent wafers from an opposite direction. FIGS. 10 and 11 correspond to the visible faces of wafers 1 and 2, respectively, in FIG. 8, and FIGS. 12 and 13 correspond to the visible faces of wafers 9 and 10, respectively, in FIG. 9. It should be apparent, then, that FIGS. 10 and 12 show opposite faces of the first wafer type, and FIGS. 11 and 13 show opposite faces of the second wafer type.

Each of the wafers has nine terminals 50 at the mounting edge 43, and nine contact pads adjacent to the mating edge 42 which are allocated as signal pads 64 and ground pads 65. The signal pads 64 are electrically connected to the signal tracks 14, and these pads 64 are all on one side or face of each wafer 13. The ground pads 65 are electrically connected to the ground tracks 15, and these pads 65 are all on the opposite side or face of each wafer. Conductive vias 66 provide electrical connections between signal and ground tracks 14, 15 which are on an opposite side of the wafer from their associated signal pads 64 and ground pads 65, respectively.

Figure 14:
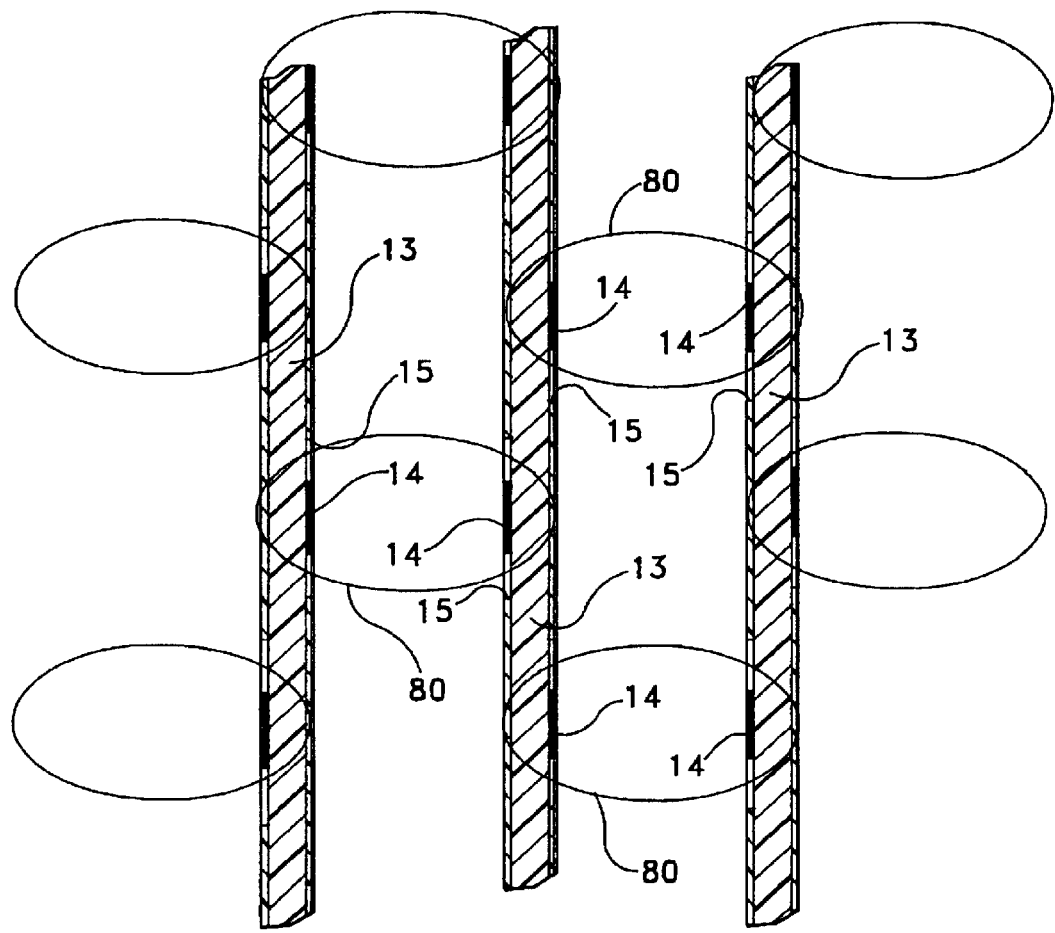
FIG. 14 is a partial cross-sectional view through three adjacent circuit boards in the connector, wherein pairs of signal tracks are opposed to each other on adjacent circuit boards.

According to the invention, signal tracks on opposed faces of adjacent wafers are substantially mirror images of each other. With reference to FIGS. 10 and 13, first and second signal tracks 71, 72 on the first type of wafer are substantially mirror images of third and fourth signal tracks 73, 74, on the second type of wafer. Similarly, with reference to FIGS. 11 and 12, fifth and sixth signal tracks 75, 76 on the second type of wafer are substantially mirror images of seventh and eighth signal tracks 77, 78 on the first type of wafer. Thus, adjacent wafers in the connector have signal tracks which are opposed to each other on opposed faces of the adjacent wafers. This provides a beneficial arrangement for use with paired electrical signals. According to the invention, pairs of tracks which are opposed to each other on adjacent wafers are dedicated to carry respective signal pairs. This aspect is illustrated in FIG. 14, wherein wafers 13 have signal tracks 14 and intervening ground tracks 15. Adjacent wafers have pairs of opposed signal tracks 14, each pair being enclosed within an imaginary ellipse 80 for illustration, and each of these pairs is dedicated to a respective electrical signal pair through the connector.

The disclosed arrangement of signal tracks promotes electrical coupling between the dedicated signal tracks of each signal pair due to their mutual proximity. An advantage of this arrangement is that, since the signal tracks in each pair are substantially mirror images of each other, the signal tracks in each pair have substantially identical length, thereby minimizing reflections of paired electrical signals.

It should be noted that successive signal tracks along each wafer couple to other signal tracks on successive alternate sides of the wafer. Thus, pairs of signal tracks are alternately staggered on opposite sides of each wafer. This provides the best possible electrical isolation of each signal pair from neighboring signal pairs.

In an alternative arrangement, multiple signal tracks on the same side of a single wafer may be paired with each other by routing pairs of the signal tracks in close mutual proximity, thereby promoting edge-wise electrical coupling between the signal tracks of each pair.

Figure 15:
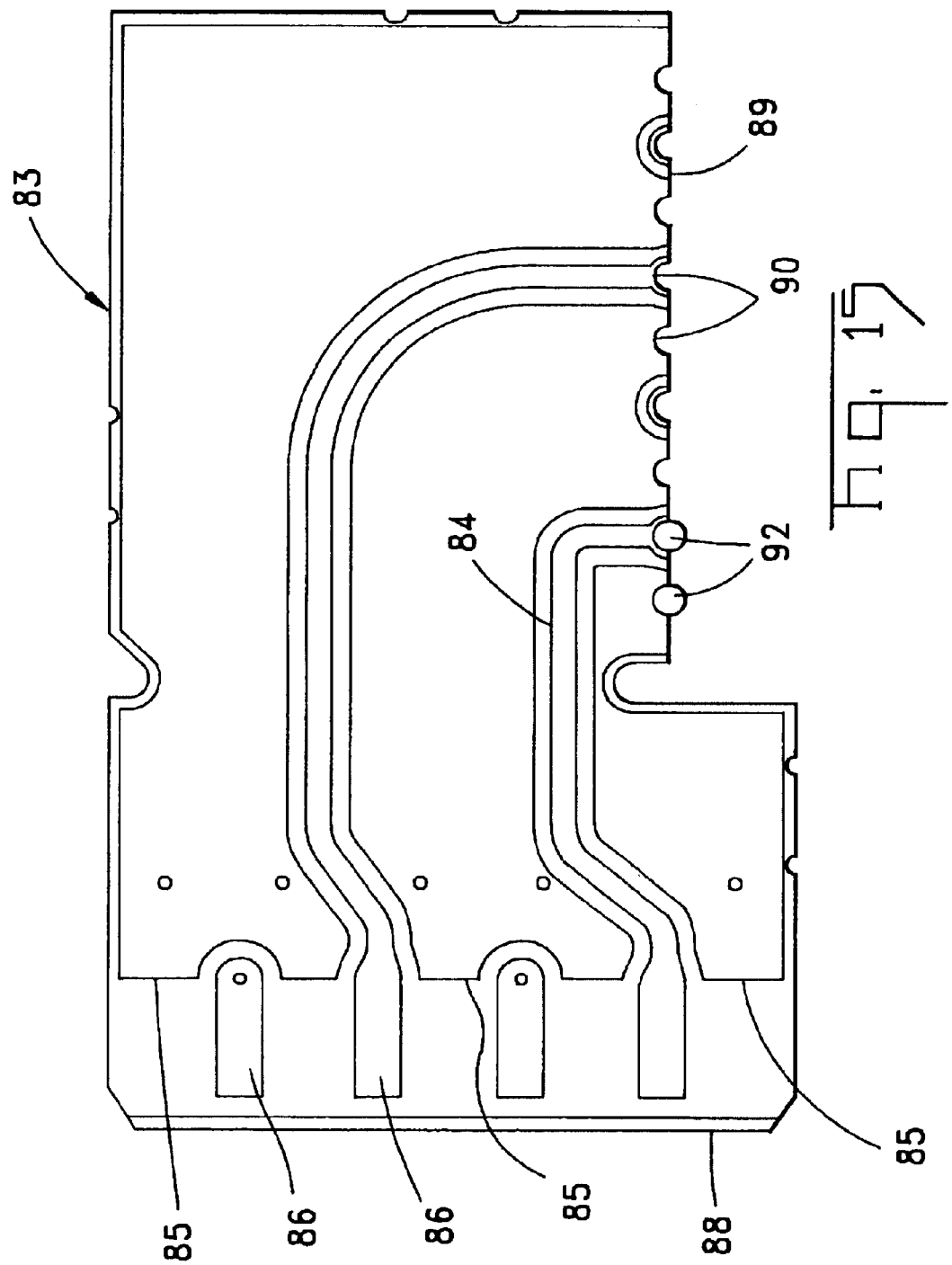
FIG. 15 is a side elevation view of an alternate embodiment of a circuit board that can be used in the connector.

FIG. 15 shows an alternate embodiment of a circuit board wafer that can be used in the invention. In this embodiment, circuit board wafer 83 has signal tracks 84 and ground tracks 85, signal pads 86, ground pads (not visible) on an opposite side of the wafer from the signal pads, a mating edge 88 and a mounting edge 89. The mounting edge 89 is formed with semi-circular cutouts 90, and the signal tracks and ground tracks extend to these cutouts. A solder ball 92 is attached to the wafer within each of the cutouts and is electrically connected to one of the signal or ground tracks 85, 86, thereby forming terminals along the mounting edge. Only two solder balls 92 are shown in FIG. 15, but it should be understood that the number of solder ball terminals would correspond to the number of signal and ground tracks on the circuit board wafer.

Figure 16:
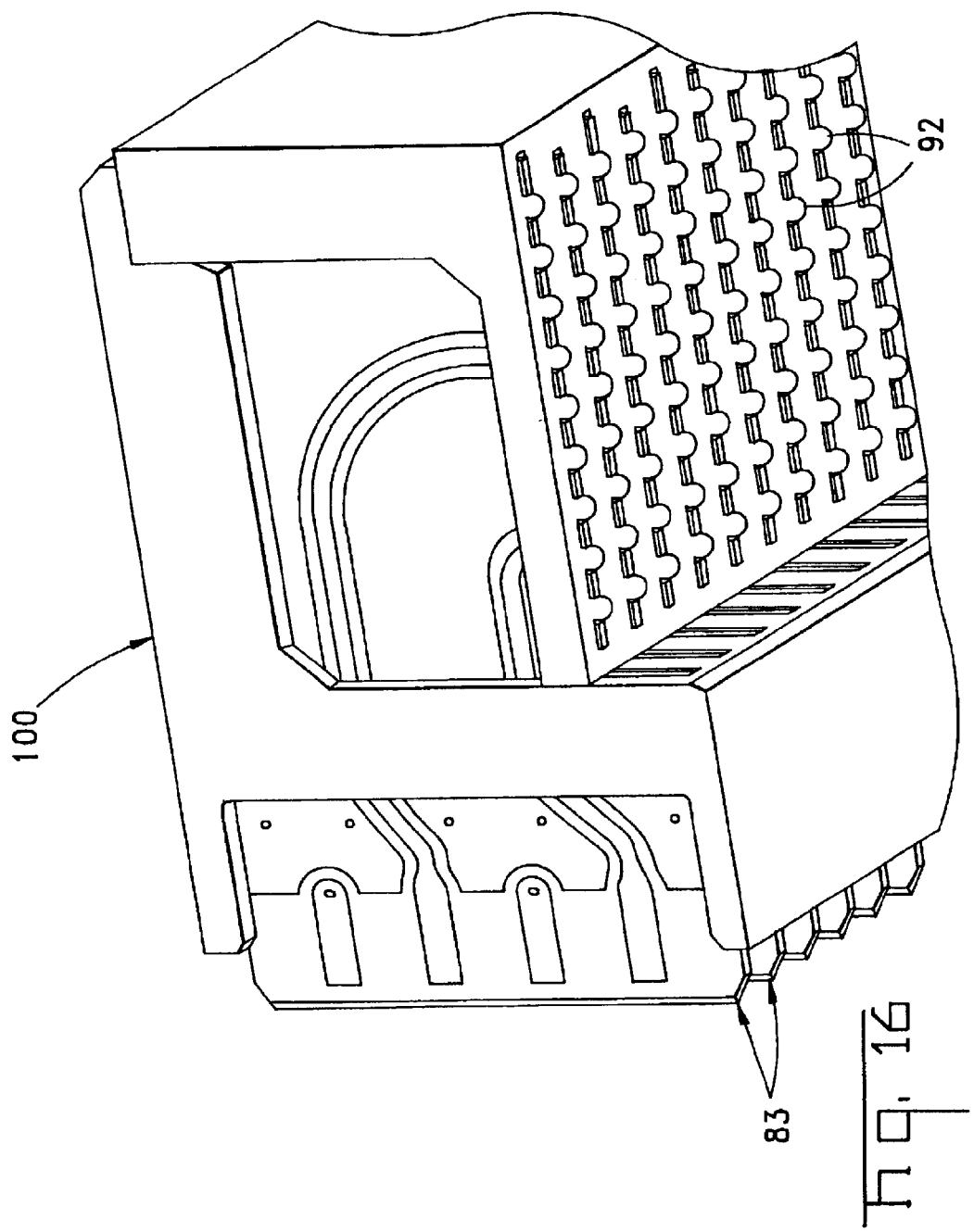
FIG. 16 is an isometric view of an electrical connector having a plurality of the circuit boards shown in FIG. 15.

FIG. 16 shows an electrical connector 100 having a plurality of the wafers 83, with the solder balls 92 forming a mounting interface for the connector.

Figure 17:
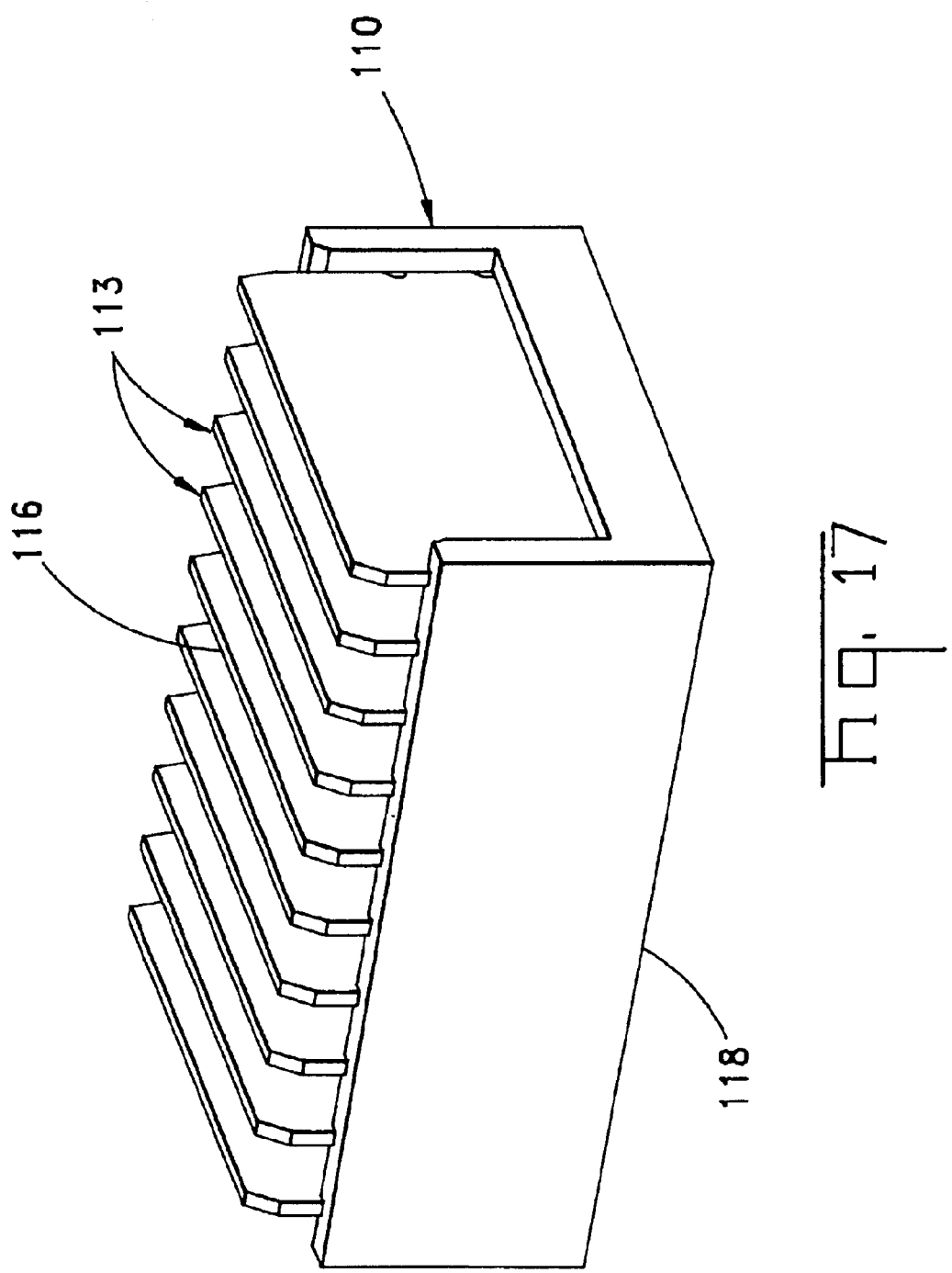
FIG. 17 is an isometric view of a vertical version of an electrical connector according to the invention.

FIG. 17 shows a vertical version of an electrical connector according to the invention. The vertical version is substantially similar to the right-angle versions previously described. However, the vertical version is used to interconnect a motherboard and daughterboard that are parallel to each other, whereas the right-angle versions are used to interconnect a motherboard and daughterboard that are perpendicular to each other. The vertical version of the connector includes a housing 110 having a plurality of circuit board wafers 113. The wafers carry signal and ground tracks that extend between a mating interface 116 and a mounting interface (along a bottom 118 of the housing 110).

The invention provides a number of advantages. The circuit board wafers offer great design flexibility in that the layout of conductive tracks on the wafers can be selected for optimum electrical performance according to customer requirements and system characteristics. The wafers can be customized to provide desirable electrical characteristics for particular applications, and variations in electrical characteristics are easily accommodated. Custom wafers can be designed and manufactured simply and easily by changing the artwork on the wafer. These custom wafers can use the same contacts, housings and assembly equipment as any other wafer, thereby allowing custom wafers to be easily interchanged with existing wafers. Thus, a customizable electrical connector is provided at relatively low expense.

The invention having been disclosed, a number of variations will now become apparent to those skilled in the art. Whereas the invention is intended to encompass the foregoing preferred embodiments as well as a reasonable range of equivalents, reference should be made to the appended claims rather than the foregoing discussion of examples, in order to assess the scope of the invention in which exclusive rights are claimed.

We claim:

1. An electrical connector comprising:

a housing and circuit boards carried by the housing, the circuit boards extending parallel to each other in spaced-apart relationship, the circuit boards extending from a mating interface at one end of the connector to a mounting interface at another end of the connector, wherein the circuit boards include a first type and a second type, the first type having circuitry arranged in a first pattern, and the second type having circuitry arranged in a second pattern which is different than the first pattern, wherein multiple circuit boards of the first and second types are arranged in an alternating sequence in the connector, wherein the circuitry includes signal tracks for carrying electrical signals through the connector, wherein said signal tracks are arranged as pairs that are dedicated to carrying pairs of related said electrical signals through the connector, wherein each said pair includes one said signal track on the first type of circuit board that is opposed to another said signal track on the second type of circuit board, and wherein the pairs of opposed signal tracks are alternately staggered on opposite sides of each said circuit board.

2. An electrical connector comprising:

a common housing having grooves, circuit boards carried by the housing, the circuit boards having edges that are disposed in the grooves, the circuit boards extending parallel to each other in spaced-apart relationship, each of the circuit boards including a substrate and conductive tracks integrally formed on the substrate, the conductive tracks providing electrical paths through the connector, the electrical paths extending from a mating interface at one end of the connector to a mounting interface at another end of the connector;

wherein the circuit boards include a first type and a second type, the first type having the conductive tracks arranged in a first pattern, and the second type having the conductive tracks arranged in a second pattern which is different than the first pattern;

wherein multiple circuit boards of the first and second types are arranged in an alternating sequence in the connector;

wherein the conductive tracks include signal tracks, and pairs or opposed signal tracks on the first and second types are dedicated to respective electrical signal pairs through the connector; and wherein the pairs of opposed signal tracks are alternately staggered on opposite sides of each said circuit board.

3. The electrical connector of claim 1 wherein the first and second patterns are mirror images of each other on opposed faces of the first and second types.

* * * * *